(12) United States Patent
Rightley et al.

(10) Patent No.: US 6,827,134 B1
(45) Date of Patent: Dec. 7, 2004

(54) PARALLEL-PLATE HEAT PIPE APPARATUS HAVING A SHAPED WICK STRUCTURE

(75) Inventors: Michael J. Rightley, Albuquerque, NM (US); Douglas R. Adkins, Albuquerque, NM (US); James J. Mulhall, Albuquerque, NM (US); Charles V. Robino, Albuquerque, NM (US); Mark Reece, Albuquerque, NM (US); Paul M. Smith, Albuquerque, NM (US); Chris P. Tigges, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 26 days.

(21) Appl. No.: 10/137,155

(22) Filed: Apr. 30, 2002

(51) Int. Cl.[7] ............................................. F28D 15/00
(52) U.S. Cl. ........................... 165/104.26; 165/104.21; 165/104.33; 361/700; 257/715
(58) Field of Search ....................... 165/104.26, 104.33; 361/700; 257/715

(56) References Cited

U.S. PATENT DOCUMENTS

| | | | | |
|---|---|---|---|---|
| 4,047,198 A | * | 9/1977 | Sekhon et al. ............... 257/713 |
| 4,170,262 A | * | 10/1979 | Marcus et al. ......... 165/104.26 |
| 4,196,504 A | * | 4/1980 | Eastman ................. 29/890.032 |
| 4,322,737 A | * | 3/1982 | Sliwa, Jr. ....................... 357/82 |
| 4,489,777 A | * | 12/1984 | Del Bagno et al. ..... 165/104.26 |
| 4,602,679 A | * | 7/1986 | Edelstein et al. ....... 165/104.26 |
| 4,616,699 A | * | 10/1986 | Grote ..................... 165/104.26 |
| 4,674,565 A | * | 6/1987 | Beam ..................... 165/104.26 |
| 4,683,940 A | * | 8/1987 | Ernst et al. .................. 165/272 |
| 4,765,396 A | * | 8/1988 | Seidenberg ............. 165/104.26 |
| 4,789,026 A | * | 12/1988 | Shank et al. ........... 165/104.26 |
| 4,880,054 A | * | 11/1989 | Yoshida et al. ............. 165/133 |
| 4,883,116 A | * | 11/1989 | Seidenberg et al. .... 165/104.26 |
| 4,964,457 A | * | 10/1990 | Leonard et al. ............. 165/272 |
| 5,076,352 A | * | 12/1991 | Rosenfeld et al. ..... 165/104.26 |
| 5,101,560 A | * | 4/1992 | Leonard et al. ........ 29/890.032 |
| 5,101,888 A | * | 4/1992 | Sprouse et al. ........ 165/104.26 |
| 5,267,611 A | * | 12/1993 | Rosenfeld .................... 165/168 |
| 5,329,996 A | * | 7/1994 | Rosenfeld .................... 165/168 |
| 5,355,942 A | * | 10/1994 | Conte .................... 165/104.33 |
| 5,725,049 A | * | 3/1998 | Swanson et al. ....... 165/104.26 |
| 5,769,154 A | * | 6/1998 | Adkins et al. ......... 165/104.26 |
| 5,947,193 A | * | 9/1999 | Adkins et al. ......... 165/104.26 |
| 6,021,662 A | * | 2/2000 | Moulu et al. .................. 73/38 |
| 6,056,044 A | * | 5/2000 | Benson et al. ......... 165/104.26 |
| 6,158,502 A | * | 12/2000 | Thomas ................. 165/104.26 |
| 6,460,612 B1 | * | 10/2002 | Sehmbey et al. ............. 165/96 |

OTHER PUBLICATIONS

D.A. Benson, S.N. Burchett, S.H. Kravitz, C.P. Tigges, C. Schmidt and C.V. Robino, *Kovar Micro Heat Pipe Substrates for Microelectronic Cooling*, Sandia National Laboratories Report No. SAND99–0714, Apr. 1999.

M.J. Rightley, C.P. Tigges, R.C. Givler, C.V. Robino, J.J. Mulhall and P.M. Smith, "Innovative Wick Design for Multi–Source, Flat Plate Heat Pipes," paper presented at THERMES 2002 Conference, Santa Fe, NM, Jan. 13–15, 2002.

* cited by examiner

Primary Examiner—Henry Bennett
Assistant Examiner—Nihir Patel
(74) Attorney, Agent, or Firm—John P. Hahimer

(57) ABSTRACT

A parallel-plate heat pipe is disclosed that utilizes a plurality of evaporator regions at locations where heat sources (e.g. semiconductor chips) are to be provided. A plurality of curvilinear capillary grooves are formed on one or both major inner surfaces of the heat pipe to provide an independent flow of a liquid working fluid to the evaporator regions to optimize heat removal from different-size heat sources and to mitigate the possibility of heat-source shadowing. The parallel-plate heat pipe has applications for heat removal from high-density microelectronics and laptop computers.

33 Claims, 2 Drawing Sheets

PARALLEL-PLATE HEAT PIPE APPARATUS HAVING A SHAPED WICK STRUCTURE

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to heat pipe technology, and in particular to a parallel-plate heat pipe having a plurality of curvilinear capillary grooves for transferring a working fluid in a liquid state from a condenser region to an evaporator region. The present invention allows multiple heat sources to be located on the parallel-plate heat pipe and minimizes the possibility of heat-source shadowing.

BACKGROUND OF THE INVENTION

A heat pipe provides a light-weight efficient passive means of transferring heat from a heat source to a heat sink. Heat pipes are currently used for heat removal or heat transfer in many applications including the cooling of electronics. A particular application of heat pipes is for cooling of integrated circuitry in high-density microelectronics and laptop computers.

One problem that arises when using heat pipes to cool integrated circuitry (also termed semiconductor chips) is that, when multiple chips are thermally coupled to a conventional heat pipe for cooling, there is the possibility for "source shadowing" in which the heat removed by a first semiconductor chip and transported to a heat sink by the heat pipe and the resupply of a working fluid to the location of the first chip by capillary action interferes with and can diminish the removal and transport of heat from a second semiconductor chip and the resupply of the working fluid to the location of the second chip. Under certain heat loadings, this can lead to a localized "dryout" of the working fluid in the heat pipe at the location of the second chip, resulting in an unacceptable rise in the temperature of the second chip which can affect its performance and reliability. As an example, when such a conventional heat pipe is used in a computer, this heat-source shadowing can limit the speed of operation of certain chips and thereby slow down operation of the computer.

The present invention provides a solution to this problem by providing a heat pipe in which a plurality of evaporator regions each used to transfer heal away from a heat source (e.g. a semiconductor chip) are independently resupplied with a quantity of a working fluid in a liquid state to prevent or mitigate any heat-source shadowing.

An advantage of the present invention is that multiple heat sources can be optimally cooled by a single heat pipe having a plurality of shaped capillary wick structures independently resupplying the working fluid in the liquid state to multiple evaporator regions at the locations of the various heat sources.

A further advantage is that a flow of the working fluid in the liquid state to each evaporator region can be sized according to the amount of heat to be transferred from a heat source at that location.

Yet another advantage is that a flow of the working fluid can be provided between a pair of major inner surfaces within the heat sink of the present invention so that performance of the heat sink is largely independent of orientation (i.e. independent of effects due to gravity).

These and other advantages of the present invention will become evident to those skilled in the art.

SUMMARY OF THE INVENTION

The present invention relates to a parallel-plate heat pipe apparatus, comprising a hollow sealed container having a pair of substantially parallel major outer surfaces, and further comprising a pair of substantially parallel major inner surfaces within the container. A plurality of evaporator regions are located on one or both of the major inner surfaces of the container, with each evaporator region being spaced apart from an adjacent evaporator region. A condenser region is located within the container proximate to an edge of one of the major inner surfaces; and a working fluid is disposed within the container for transferring heat from each evaporator region to the condenser region wherein the working fluid is condensed from a vapor state to a liquid state. The heat pipe further includes a plurality of shaped capillary wick structures formed within the container on one or both of the major inner surfaces of the container, with each capillary wick structure further comprising a plurality of curvilinear capillary grooves to provide a capillary flow of the working fluid in the liquid state from the condenser region to one of the plurality of evaporator regions. According to the present invention, the container can comprise a metal (e.g. copper or aluminum) or a semiconductor (e.g. silicon); and the working fluid can comprise, for example, water or methanol. A metal container can be assembled, for example, from a pair of substantially parallel flat or curved plates welded at the edges thereof to an intervening annular metal spacer.

The capillary grooves preferably follow calculated curvilinear fluid-flow paths between the condenser region and one of the evaporator regions, with the fluid-flow paths preferably determined from a solution of Laplace's Equation. The number and dimensions of the capillary grooves within each capillary wick structure can be selected according to a quantity of the working fluid in the liquid state to be transferred from the condenser region to each evaporator region. Each curvilinear capillary groove can be formed, for example, from an electroplated metal. Additionally, to prevent clogging of the flow of the working fluid in the capillary grooves, a plurality of interconnections (i.e. openings) can be formed between adjacent capillary grooves within each capillary wick structure to permit the transfer of the working fluid in the liquid state between the adjacent grooves.

A plurality of support posts can be provided inside the container for rigidity, with each support post generally being attached at each end thereof to one of the major inner surfaces of the container (e.g. by resistance welding). The support posts can comprise a metal (e.g. copper or aluminum) or a semiconductor (e.g. silicon). An optional annular wick structure can also be provided within the container to provide a fluid pathway between the major inner surfaces of the container for the working fluid 110 in the liquid state. The annular wick structure can comprise a sintered metal felt (e.g. comprising stainless steel), and can be located proximate to the support posts or proximate to an inside edge of the container.

The present invention also relates to a parallel-plate heat pipe apparatus for transferring heat away from a plurality of heat sources, comprising a sealed container having an evaporator region superposed below each heat source, and a condenser region located proximate to an edge of the container; a working fluid disposed within the container for transferring heat from each evaporator region to the condenser region in a vapor state; and a plurality of spaced-apart curvilinear capillary grooves connecting the condenser region to each evaporator region for returning the working fluid in a liquid state to the evaporator region to replace any of the working fluid evaporated therefrom. The capillary grooves, which are generally interconnected, can comprise an electroplated metal, or alternately can be etched into the material (e.g. a metal such as copper or aluminum, or silicon). The working fluid can comprise water or methanol. The heat pipe container can further include one or more spacers located between a pair of opposing major inner surfaces of the container; and a sintered metal wick structure can be optionally located within the container to provide a path for the working fluid as a liquid between the opposing major inner surfaces of the container.

The present invention also relates to a parallel-plate heat pipe apparatus for conducting heat from a heat source to a heat sink that comprises a pair of substantially parallel plates connected together to form a hollow sealed container. An evaporator region is located on a portion of a major inner surface of one of the pair of parallel plates proximate to where the heat source is to be attached; and a condenser region is located within the container proximate to a side of the container where the heat sink is to be attached. A working fluid is disposed within the interior of the container for transferring heat from the evaporator region to the condenser region in a vapor state. A plurality of capillary grooves are formed on the major inner surface on one or both of the parallel plates to transfer the working fluid in a liquid state by capillary action from the condenser region to the evaporator region. These capillary grooves are preferably arranged along paths defined by a calculated flow of the working fluid in the liquid state; and a majority of the plurality of capillary grooves are curvilinear.

The amount of the working fluid loaded into the heat pipe can be precisely determined by completely filling the container with the working fluid, and using a timed evacuation procedure to remove a portion of the working fluid from the container. The parallel-plate heat pipe can further include a plurality of support posts located between the pair of plates and attached at each end thereof to one of the pair of the plates (e.g. by resistance welding). Additionally, a sintered metal wick structure can be located within the container (e.g. proximate to each support post, or proximate to one or more inside edges of the container) to provide a flow path for transfer of the working fluid in the liquid state between the pair of plates. A timed evacuation procedure can be used to load a predetermined quantity of the working fluid into the heat pipe.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
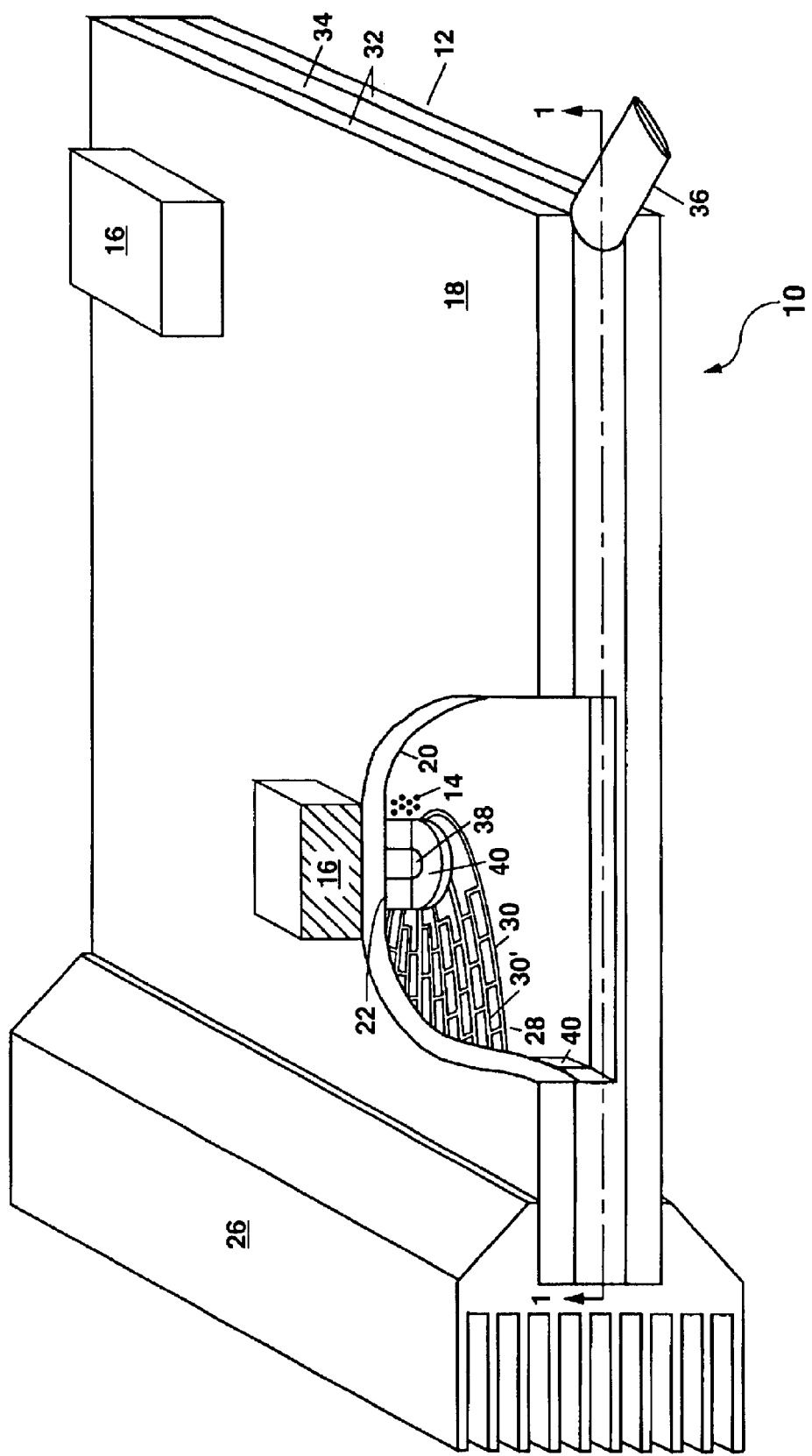
FIG. 1 shows a perspective view of a parallel-plate heat pipe according to the present invention with a cut-away portion to illustrate details within the heat pipe.

Referring to FIG. 1, there is shown an example of a parallel-plate heat pipe apparatus 10 according to the present invention. The apparatus 10 comprises a hollow sealed container 12 that can be substantially flat or curved, and that has a working fluid 14 disposed therein. When the container 12 is stated as being substantially flat, this means that the container comprises a pair of major outer surfaces 18 that are flat over a majority of the surface area thereof, but which can have rounded edges. Additionally, the major surfaces 18 are preferably substantially parallel to each other, and are larger than any minor surfaces (i.e. edges) of the container. In the parallel-plate heat pipe 10 of FIG. 1, the working fluid 14 is used to conduct heat in a vapor phase (i.e. a vapor state produced by evaporating the working fluid 14 from a liquid state) from one or more heat sources 16 (e.g. semiconductor chips) in contact with a major outer surface 18 of the heat pipe 10 and to transport this heat to a cooler region of the heat pipe 10 where the vapor is condensed back into a liquid phase (i.e. the liquid state).

The region of a major inner surface 20 within the heat pipe 10 superposed below each heat source 16 is termed herein an evaporator region 22 since this is the region where heat from the heat source 16 can evaporate the working fluid 14 from the liquid state to the vapor state, with the working fluid 14 in the vapor state carrying away a quantity of heat equal determined by the heat capacity and heat of vaporization of the working fluid 14. A cooler region of the heat pipe 10, which is generally located near an edge of the heat pipe 10 proximate to a heat sink 26, is termed herein a condenser region 24 since here the working fluid 14 can condense and transfer to the region 24 the quantity of heat contained in the vapor state to the heat sink 26.

According to the present invention, there can be a plurality of evaporator regions 22 on one or both major inner surfaces 20 transferring heat to generally only a single condenser region 24 (although in other embodiments of the present invention, there can be more than one condenser region 24). The condenser region 24 can be located on a side of the heat pipe 10 which can be an edge, or alternately can be located on a major inner surface of the container 12 opposite a major inner surface 20 whereon one or more of the evaporator regions 22 are located. The side of the heat pipe 10 containing the condenser region 24 is generally in thermal contact with a heat sink 26. The heat sink 26 can be attached to the heat pipe 10, for example, using a thermally-conductive adhesive, a weld or an interference fit.

In the example of FIG. 1, the interior of the heat-pipe container 12 is evacuated prior to loading the heat pipe 10 with the working fluid 14. The working fluid 14 is then loaded into the interior of the heat pipe 10 in sufficient quantity to establish an equilibrium condition between the working fluid 14 in the liquid and vapor states. As a result, when the working fluid 14 is heated to evaporation at the evaporator regions 22, these regions are cooled by the evaporation of the working fluid 14. The working fluid 14 in the vapor state then recondenses into a liquid at the condenser region 24 which is cooler due to the attached heat sink 26, carrying with it the heat of vaporization of the fluid 14. The working fluid 14 in the liquid state is replenished at the evaporator regions 22 by flow via capillary action in a plurality of shaped capillary wick structures 28 formed on one or both major inner surfaces 20. This provides a closed-loop flow of the working fluid 14 which requires no pump and which consumes none of the working fluid 14. Thus, the heat pipe 10 of the present invention is a closed, passive system that can provide an efficient heat transfer from a plurality of heat sources 16 to a heat sink 26.

Figure 2:
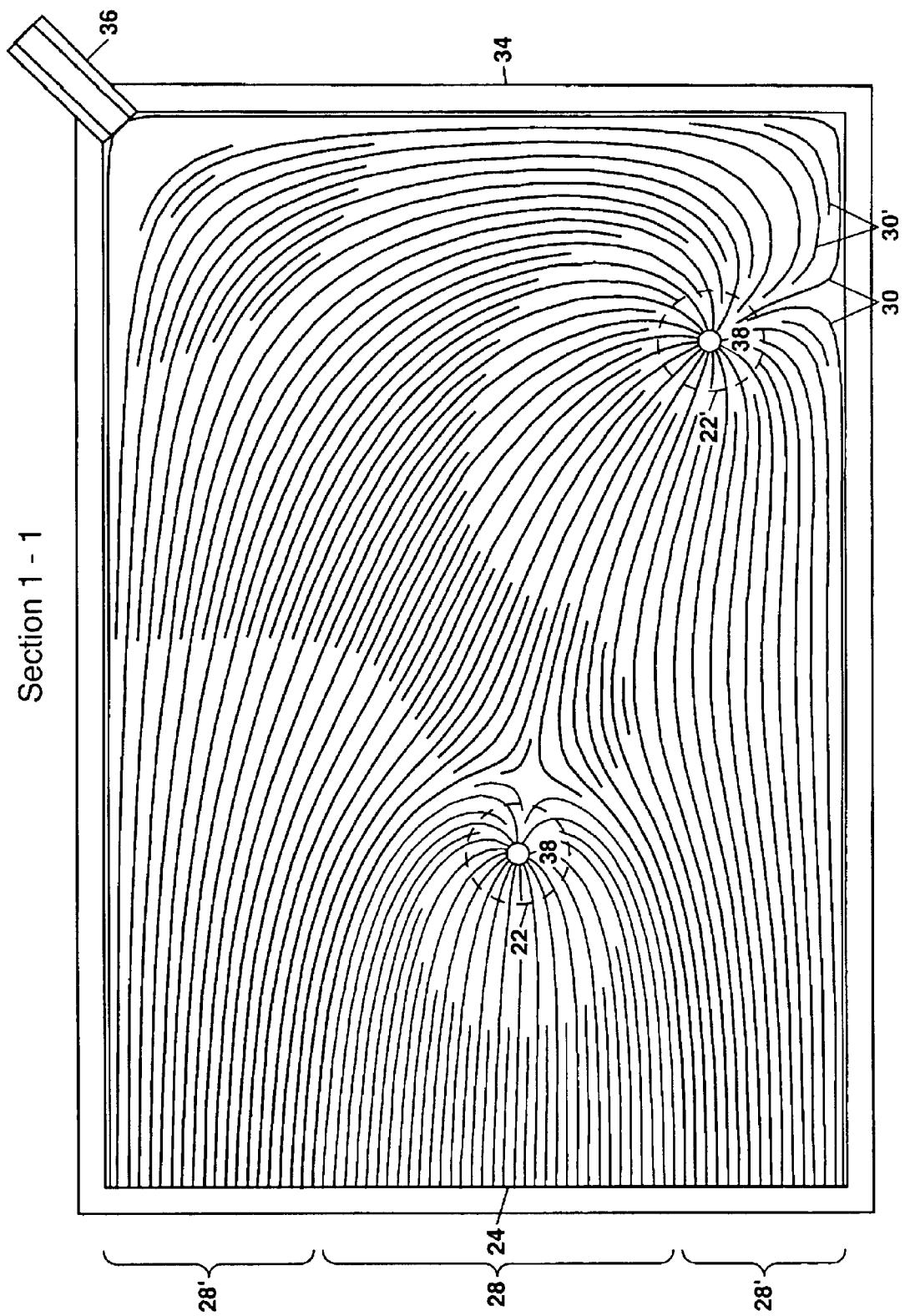
FIG. 2 shows a plan view of the interior of the device of FIG. 1 along the section line 1—1, with each sintered metal felt wick structure omitted for clarity in order to illustrate the arrangement of the capillary grooves for replenishing the working fluid to the two evaporator regions superposed below the heat sources.

Each shaped capillary wick structure 28 comprises a plurality of generally curvilinear (i.e. curved) capillary grooves 30 to supply the working fluid 14 as a liquid to a particular evaporator region 22 which is generally sized to be about the size of the heat source 16 to be provided in thermal contact with the evaporator region 22. In the example of FIGS. 1 and 2, a first capillary wick structure 28 supplies the liquid working fluid 14 to a first evaporator region 22; and a second capillary wick structure 28' supplies the liquid working fluid 14 to a second evaporator region 22'. In some cases (e.g. when capillary wick structures 28 are formed on a pair of opposing major inner surfaces 20 as shown in the example of FIGS. 1 and 2, then two capillary wick structures 28 can be used, with one structure 28 located on each major inner surface 20, and with a means for transferring the liquid working fluid 14 between the two major inner surfaces 20 as will be described in detail hereinafter.

According to the present invention, a quantity of the working fluid 14 to be provided to each evaporator region 22 as a liquid can be predetermined according to the heat loading expected to be provided by a particular heat source 16. Each capillary structure 28 can then be independently sized and shaped as described hereinafter to provide sufficient working fluid 14 in liquid form to the evaporator regions 22 to prevent a "dryout" condition during normal operation under the expected heat loading. "Dryout" occurs when the liquid working fluid 14 is not supplied as a liquid at a sufficient rate to replace the heat-induced evaporation within a particular evaporator region 22. When this occurs, heat cannot be efficiently removed from the heat load 16 by the device 10 so that the temperature at the heat source 16 can rise.

In the example of FIG. 1, the hollow sealed container 12 can comprise a metal (e.g. copper or aluminum) or a semiconductor (e.g. silicon). A metal container 12 can be formed, for example, by sandwiching a pair of substantially flat or curved metal plates 32 (e.g. about 0.5–1 mm thick) about an intervening flat or curved annular spacer 34 (e.g. about 1 mm thick) as shown in FIG. 1 and then hermetically bonding the plates 32 and the spacer 34 together (e.g. by electron beam welding). The spacer 34 is used to form an open central interior region of the heat pipe 10 wherein the working fluid 14 can exist in the vapor state and move between the evaporator regions 22 and the condenser region 24. The spacer 34 generally comprises the same material as the plates 32 and can be formed, for example, from a stamped or machined plate, or alternately from a wire or ribbon.

A metal fill tube 36 (e.g. 1.6 mm outer diameter) can be provided between the pair of plates 32 in an opening formed through the spacer 34 and then attached in place (e.g. by electron beam welding). The fill tube 36 is used to evacuate the interior of the container 12, to load the container with a quantity of the working fluid 14 and then can be sealed by crimping with a pinch-off tool to complete formation of the heat pipe 10.

Those skilled in the art will understand that there are other ways of forming the container 12. In other embodiments of the present invention, the container 12 can be formed, at least in part, from a semiconductor such as silicon. This can be done, for example, by patterning and etching a recess in one or both of a pair of semiconductor plates (also termed substrates herein), and then attaching the substrates together so that the etched recesses define the major inner surfaces 20 in the interior of the container 12. The two semiconductor substrates can be attached together, for example, using diffusion bonding (e.g. after forming an oxide layer on the surfaces to be diffusion bonded), or an adhesive. Alternately, the surfaces or edges of the semiconductor substrates to be attached together can be metallized so that the two substrates can be bonded by soldering or welding. A metal fill tube 36 can be attached to an opening formed in one or both of the semiconductor substrates for evacuating, filling and sealing the heat pipe 10.

Prior to assembling the plates 32 together to form the heat-pipe container 12, a plurality of shaped capillary wick structures 28 are formed on one or both major inner surfaces 20 of the container. This can be done by using photolithography to form a patterned mask (e.g. comprising a layer of a photolithographic resist) on a major surface of one or both of the plates 32 with a plurality of elongate curvilinear openings corresponding to the shape of a plurality of capillary grooves 30 to be formed on the plates 32. The formation of the shaped capillary wick structures 28 is preferably performed while the plates are flat due to constraints on photolithography on curved surfaces. The plates 32 can then be bent into a curved shape prior to assembly of the heat-pipe container 12 so that the resultant container contains a plurality of parallel major surfaces 18. In other embodiments of the present invention, a plurality of substantially flat plates 32 can be patterned to form shaped capillary wick structures 28 therein; and then the flat plates 32 can be assembled to form an arbitrary-shaped container 12 (e.g. an L-shape) comprising a plurality of parallel plates 32.

The pattern for the mask is preferably determined from a solution to a fluid-flow calculation, taking into account the overall shape of the heat pipe 10, the location and relative strength (i.e. power) of the various heat sources 16 and the location of the evaporator regions 22 and the condenser region 24. A mathematical model of fluid flow is described by Laplace's equation:

$$\nabla^2 \phi = 0 \left( i.e. \ \frac{\partial^2 \phi}{\partial x^2} + \frac{\partial^2 \phi}{\partial y^2} = 0 \right)$$

where the velocity potential $\phi(x, y)$ is related to the flow velocity vector $\bar{v}$ by:

$$\bar{v} = \nabla \phi \left( i.e. \ v_x = \frac{\partial \phi}{\partial x}, v_y = \frac{\partial \phi}{\partial y} \right)$$

Laplace's equation above assumes that the fluid is incompressible (i.e. that the pressure is constant), that there is no viscosity (i.e. no friction) and that the fluid cannot rotate to form vortices.

After dividing each heat source 16 into a number of equal-strength point flow sources, with the exact number of the point flow sources being dependent on the relative heat power provided by each source 16, and further subdividing the condenser region 24 into a number of sub-regions corresponding to the number of point flow sources, Laplace's equation above can be solved numerically using any of a number of computer programs for solving Laplace's equation known to those skilled in the art.

A graphical display of the calculated solution to Laplace's equation provides a plurality of equipotential flow streamlines (see FIG. 2) which are tangent to the flow velocity vector, $\bar{v}$, at every point in the flow field and which are spaced apart by a predetermined increment in the velocity potential $\phi$. The capillary grooves 30 can be located along these equipotential flow streamlines, which are curvilinear in shape, to provide a return path for the working fluid 14 in the liquid state from the condenser region 24 to each evaporator region 22. This arrangement of capillary grooves 28 between each evaporator region 22 and the condenser region 24 forms a capillary wick structure 28 having a shape that is adapted to optimally supply the working fluid 14 in sufficient quantity from the condenser region 24 back to a particular evaporator region 22 while mitigating against possible heat-source shadowing.

Secondary capillary grooves 30' can be optionally provided between the calculated flow streamlines to further increase the capillary pressure of the liquid working fluid 14 in the device 10. These secondary capillary grooves 30' generally do not span the entire distance between the condenser region 24 and one of the evaporator regions 22, but cover only a part of the distance, and are interconnected to adjacent capillary grooves 30 at multiple points (see FIGS. 1 and 2). These secondary capillary grooves 30' are advantageous to increase the capillary flow of the working fluid 14 from the condenser region 24 to the evaporator region 22, and to provide alternate flow paths for the working fluid 14 in the event that certain of the capillary grooves 30 become blocked by contaminants, or are defectively formed during manufacture of the device 10.

Additionally, the dimensions of the interconnections between the capillary grooves 30 and 30' can be used to control the flow of the working fluid 14 between the grooves 30 and 30'. In this way, a permeability of each wick structure 28 in a direction transverse to the direction of the grooves 30 and 30' can be controlled and varied over a range of up to several orders of magnitude. This can be useful, for example, if a plurality of wick structures are interconnected to provide a limited flow of the working fluid 14 in the liquid state between wick structures while still preventing any heat-source shadowing under normal operating conditions of the heat pipe 10.

As shown in FIG. 2, multiple shaped capillary wick structures 28 and 28' can be formed according to the present invention, with each capillary wick structure 28 and 28' in the example of FIGS. 1 and 2 being separate from (i.e. unconnected to) any other capillary wick structure 28' formed on the same plate 32. In this example of the present invention, heat-source shadowing is effectively prevented by providing each evaporator region 22 with its own supply of the liquid working fluid 14 from the condenser region 24. Thus, the evaporator region 22 in FIG. 2 which is closest to the condenser region 24 and supplied with liquid working fluid 14 by the capillary wick structure 28 will not under normal operating conditions affect the performance of the heat sink 10 at the second evaporator region 22' which is independently supplied with the liquid working fluid 14 by the capillary wick structure 28'. As a result, according to the present invention, each evaporator region within the heat sink 10 can be optimized for removal of the expected heat loading at that location. This optimization entails selecting the number of capillary grooves 30 and secondary capillary grooves 30' for each wick structure 28 and the dimensions of the grooves 30 and 30' in terms of length, height and width to provide a sufficient capillary flow of the working fluid 14 to each evaporator region 22 for operation with a specified heat loading provided by a source 16 without the evaporator region 22 drying out.

After the design of each shaped capillary wick structure 28 is completed based on the results of the solution to Laplace's equation and the addition of secondary capillary grooves 30' as needed, a mask layout file can be generated to define the shape and location of each capillary groove 30 and 30'. This file can then be used to produce one or more reticles that can be used to form photolithographic masks (e.g. comprising a patterned layer of a masking material such as photoresist) on a surface 20 of one or more plates 32 used to form the container 12 based on a series of steps well-known to those skilled in the semiconductor fabrication art.

Multiple plates 32 can be processed in parallel on a large plate (e.g. a 6-inch diameter substrate) and later cut apart and used to form a batch of heat pipes 10. The mask can be designed to cover the locations of each capillary groove 30 and 30' and interconnections therebetween and also an outer annulus about the plates 32 wherein the spacer 34. The remainder of the major inner surface 20 of the plate 32 can then be built up by electroplating metal (e.g. copper or aluminum) onto the plate 32 to a thickness of, for example, 60 $\mu$m when the capillary grooves 30 and 30' are 40 $\mu$m wide. The spacing between adjacent capillary grooves 30 can be in the range of 25 to 150 $\mu$m, for example, with the exact spacing between adjacent capillary grooves and the lateral dimensions of the interconnections controlling a permeability of the shaped capillary wick structure 28.

Those skilled in the art will understand, based on the teachings of the present invention, that there are other ways of forming the capillary grooves 30 and 30'. For example, sidewalls of the capillary grooves 30 and 30' can be built-up by electroplating metal without a need to electroplate metal over the entire exposed surface 20 of the plate 32. In other embodiments of the present invention, the curvilinear capillary grooves 30 and 30' can be etched, engraved or stamped into the plate 32. Wet or dry (i.e. plasma) etching through a patterned photolithographically-defined mask can also be used to form the curvilinear capillary grooves 30 and 30' (e.g. when the plates 32 comprise a semiconductor such as silicon).

Those skilled in the art will further understand that, although the capillary grooves 30, are preferably formed along flow streamlines determined from a solution of Laplace's Equation (or alternately Poisson's Equation: $\nabla^2 \phi = 4\pi\rho$ where $\rho$ represents a relative source strength of a heat source 16), in other embodiments of the present invention, the capillary grooves 30 can be arranged along arbitrary lines that are predominantly curvilinear with the caveat that the capillary grooves 30 connected to one evaporator region 22 on a plate 32 do not intersect or cross over the capillary grooves 30 connected to another evaporator region 22' located on the same plate 32 unless the evaporator regions 22 and 22' are located close together.

A familiarity with solutions to Laplace's Equation (or alternately Poisson's Equation) taken together with the teachings of the present invention can allow one skilled in the art to form an arrangement of capillary grooves 30 connecting the condenser region 24 to a plurality of evaporator regions 22 in the heat pipe 10 that will be useful for many applications where the exactitude of a formal numerical solution to Laplace's Equation (or Poisson's Equation) is not required, for example, when the heat pipe 10 will not be subject to high heat loading under normal operating conditions. This can be done, for example, by drawing a series of juxtaposed curvilinear lines from all sides of each evaporator region 22 to the condenser region 24, with the lines being approximately equidistantly spaced over a majority of their length. The capillary grooves 30 can then be arranged to follow these drawn lines; and additional secondary capillary grooves 30' can be optionally added between adjacent capillary grooves 30 as space permits, with the secondary capillary grooves 30 being interconnected at multiple points to the capillary grooves 30. In this way, a flow of the liquid working fluid 14 to one evaporator region 22 can be arranged so that it does not interfere with a flow of the liquid working fluid 14 to another evaporator region 22' so that any heat-source shadowing is mitigated in the device 10.

Returning to FIGS. 1 and 2, a plurality of support posts 38 can be provided to separate the plates 32, with the support posts 38 generally being located within the evaporator regions 22 and 22'. The support posts 38 will generally comprise the same metal (e.g. copper or aluminum) or semiconductor (e.g. silicon) material used to form the plates 32. For example, when the plates 32 comprise copper, the support posts 38 can also comprise copper so that resistance welding can be used to weld the posts 38 to the plates 32. Resistance welding utilizes a high-current electrical pulse supplied between the pair of plates 32 at the location of the intervening support post 38 to produce localized resistance heating and thereby weld these parts together.

Those skilled in the art will understanding that there are other ways of forming the support posts 38. For example, the posts 38 can be electroplated onto the major inner surface 20, or formed by LIGA (an acronym based on the first letters for the German words for lithography and electroplating). As another example, semiconductor support posts 38 can be formed monolithically within one or both semiconductor plates 32 by masking off a portion of the semiconductor material wherein the posts 38 are to be formed and then etching downward through the remaining unmasked semiconductor material to form the major inner surfaces 20 (a raised edge can also be formed during this etching step by masking off an annular region around the edge of the plates 32).

The support posts 38 are beneficial to maintain the rigidity of the parallel-plate heat pipe 10 during evacuation and charging with the working fluid 14 and during operation. The support posts can be, for example, cylindrical as shown in FIGS. 1 and 2, and can have a length equal to the distance between the major inner surfaces 20 of the plates 32. The support posts 38 can be optionally grooved along the length thereof to form a plurality of capillaries that are useful for transferring the working fluid 14 in the liquid state between the pair of plates 32 (e.g. when a capillary structure 28 is formed on each plate 32 to supply the working fluid 14 to the same evaporator region 22 located on one of the plates 32). Forming grooves in the support posts 38 can be done rather simply when the support posts 38 are formed by etching, plating or LIGA.

An annular wick structure 40 can be provided within the container 12 to provide a fluid pathway to transfer the working fluid 14 in the liquid state between the pair of plates 32 by capillary action when the support posts 38 are ungrooved as in the example of FIGS. 1 and 2. This wick structure 40, which can be located proximate to each support post 38 or at one or more inside edges of the container 12 or both as shown in FIG. 1, also helps to reduce the sensitivity of the device 10 to orientation effects (i.e. gravity). The wick structure 40 can comprise a porous sintered stainless steel metal felt. When the wick structure 40 is located about the support posts 38, each wick structure 40 can have, for example, an inner diameter of one-tenth of an inch and an outer diameter of up to three-tenths of an inch or more. When the wick structure 40 is located at one or more inside edges of the container 12, the wick structure 40 can have a width of up to a few tenths of an inch.

The porosity of the wick structure 40 can be controlled based on a density and thickness of the stainless steel metal felt prior to sintering, with the metal felt then being compressed to a predetermined final thickness between the plates 32. At this point, the wick structure 40 can be sintered in an inert ambient (e.g. argon) at a high temperature. The resulting wick structure 40 is substantially rigid and adheres well to the major inner surfaces 20 of the container 12 formed by the plates 32 and further increases the rigidity of the heat pipe 10.

Assembly of the parallel-plate heat pipe 10 of the present invention can be accomplished, for example, using electron-beam autogeneous edge welding to seal around the perimeter edge of the plates 32 and intervening spacer 34 with the support posts 38 and optional wick structure 40 located between the plates 32. The fill tube 36 can then be inserted into an opening formed through the spacer 34 and permanently attached, for example, with a fillet weld using the same electron-beam autogeneous welding process.

Once the welding is completed, the support posts 38 can be adhered to the plates 32 using resistance welding. To aid in resistance welding the support posts 38 to the plates 32, a braze foil interlayer can be provided between the posts 38 and the plates 32, if needed, or alternately the posts 38 can be plated (e.g. with nickel) to form the interlayer. This interlayer (not shown) can be beneficial when the posts 38 and plates 32 comprise certain metals such as copper since the interlayer helps to localize the resistance heating at an interface between the posts 38 and the major inner surface 20 of the plates 32. Those skilled in the art will understand that other types of welding can be used for forming the heat pipe 10 of the present invention depending upon the type of metal used to form the container 12. These other types of welding can include, for example, include laser welding, ultrasonic welding, gas-metal arc welding, or gas-tungsten arc welding.

Once assembled, the device 10 can be charged with the working fluid 14 (either water or methanol) using a timed evacuation procedure as described hereinafter. With this procedure, charging of the heat pipe 10 can be accomplished by first completely evacuating the interior of the heat pipe 10 with a vacuum pump connected to the fill tube 36 through a valve manifold. At this point, the heat pipe 10 can be checked to ensure hermeticity (i.e. the absence of any leaks) by valving off the vacuum pump and measuring the pressure change, if any, in the fill tube using a vacuum gauge.

Once the hermeticity of the heat pipe 10 is established, a valve connecting the fill tube 36 to a reservoir containing the liquid working fluid 14 can be opened to completely fill the interior of the evacuated heat pipe 10 with the liquid working fluid 14, and then the valve can be closed. The valve to the vacuum pump can then be opened to evacuate the working fluid 14 from the heat pipe. When this is done, the working fluid 14 can be evacuated in the vapor state with the vapor pressure in the heat pipe 10 remaining substantially constant due to evaporation of the liquid working fluid 14 so long as there is any liquid working fluid 14 in the heat pipe 10. Once all the liquid working fluid 14 is gone, the vacuum gauge pressure will drop as the remaining vapor phase working fluid 14 is evacuated. The time, $t_0$, required to evacuate the heat pipe 10 to this point can be measured (e.g. by using a chart recorder to record the vacuum gauge pressure over time).

The heat pipe 10 can then be filled again with the liquid working fluid 14 as described previously, and another evacuation of the working fluid 14 can be commenced. This time, however, the fill tube 36 is crimped to seal the heat pipe with a predetermined quantity of the liquid working fluid 14 inside at a time, $t_{charge}$, given by:

$$t_{charge} = (1 - x_{fill}) t_0$$

where $X_{fill}$ corresponds to a calculated fraction of the interior volume of the heat pipe 10 necessary to completely fill all the capillary grooves and the wick structures 40 with the liquid working fluid 14. The interior volume fraction, $x_{fill}$ can be calculated from the dimensions of all the capillary grooves (i.e. the grooves 30 and 30' and any grooves formed in the support posts 38), the interconnections between the capillary grooves and the porosity of the wick structures 40 as determined from the aerial density and final thickness after of the wick structures 40 after compression and sintering. As an example, the interior volume fraction, $X_{fill}$, can be 10–20 percent of the interior volume of the heat pipe 10 in the example of FIGS. 1 and 2. Generally, it is not necessary to overcharge the heat pipe 10 beyond the volume fraction, $x_{fill}$, since this can degrade device performance. The heat pipe 10 can also be carefully weighed before and after this timed evacuation procedure for charging the device 10 to verify the accuracy of the timed evacuation procedure.

The exact dimensions and shape of the parallel-plate heat pipe 10 of the present invention will depend upon the number and size of the heat sources 16 with which the device 10 is to be used, the space allotted for the heat pipe 10, and the characteristics of a heat sink to be used with the heat pipe 10 (e.g. the size and shape of the heat sink and whether the heat sink is to be operated with convection or forced-air cooling). As an example, the heat pipe 10 can be square or rectangular with lateral dimensions in the range of 2–20 centimeters, and with a thickness of up to a few millimeters (e.g. 1.5–3 mm).

Other applications and variations of the present invention will become evident to those skilled in the art. For example, the present invention allows heat sources 16 to be located in thermal contact with both major outer surfaces 18 of the parallel-plate heat pipe 10 for certain applications. Additionally, although the parallel-plate heat pipe 10 has been described in terms of construction from parallel plates 32 with an intervening annular spacer 34, those skilled in the art will understand that the spacer 34 can be easily eliminated in other embodiments of the present invention by upturning the edges of one or both of the plates 32 slightly (e.g. by pressing, molding, stamping, etching, etc.) to provide an appropriate spacing within the container 12 between the pair of plates 32.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A parallel-plate heat pipe apparatus, comprising:
   (a) a hollow sealed container comprising a pair of substantially parallel major outer surfaces, and further comprising a pair of substantially parallel major inner surfaces within the container;
   (b) a plurality of evaporator regions located on one of the major inner surfaces of the container, with each evaporator region being spaced apart from an adjacent evaporator region;
   (c) a condenser region located within the container proximate to an edge of one of the major inner surfaces;
   (d) a working fluid disposed within the container for transferring heat from each evaporator region to the condenser region wherein the working fluid is condensed from a vapor state to a liquid state; and
   (e) a plurality of shaped capillary wick structures formed within the container on one or both of the major inner surfaces of the container, with each capillary wick structure further comprising a plurality of curvilinear capillary grooves directly connecting the condenser region to each evaporator region to provide a capillary flow of the working fluid in the liquid state from the condenser region to one of the plurality of evaporator regions.

2. The apparatus of claim 1 wherein the capillary grooves comprise an electroplated metal.

3. The apparatus of claim 1 wherein the capillary grooves are interconnected.

4. The apparatus of claim 1 wherein number and dimensions of the capillary grooves within each capillary wick structure are selected according to a quantity of heat to be transferred from each evaporator region to the condenser region.

5. The apparatus of claim 1 wherein the capillary grooves follow calculated curvilinear fluid-flow paths between the condenser region and one of the evaporator regions on one or both major inner surfaces of the container.

6. The apparatus of claim 5 wherein the calculated curvilinear fluid-flow paths are determined from a solution of Laplace's Equation.

7. The apparatus of claim 1 wherein the container comprises metal or a semiconductor.

8. The apparatus of claim 1 wherein the container comprises copper or aluminum.

9. The apparatus of claim 1 wherein the working fluid comprises water or methanol.

10. The apparatus of claim 1 further comprising a plurality of support posts located inside the container, with each support post being attached at each end thereof to one of the major inner surfaces of the container and located within one of the evaporator regions above which a heat source is to be located.

11. The apparatus of claim 10 wherein the support posts comprise metal or a semiconductor.

12. The apparatus of claim 10 further comprising an annular wick structure located within the container to provide a fluid pathway between the major inner surfaces of the container for the working fluid in the liquid state.

13. The apparatus of claim 12 wherein the annular wick structure is located proximate to each support post.

14. The apparatus of claim 12 wherein the annular wick structure comprises a sintered metal felt.

15. A parallel-plate heat pipe apparatus for transferring heat away from a plurality of heat sources, comprising:
   (a) a sealed container having an evaporator region superposed below each heat source, and a condenser region located proximate to an edge of the container;
   (b) a working fluid disposed within the container for transferring heat from each evaporator region to the condenser region in a vapor state; and (c) a plurality of spaced-apart curvilinear capillary grooves directly connecting the condenser region to each evaporator region for returning the working fluid in a liquid state to the evaporator region to replace any working fluid evaporated therefrom.

16. The apparatus of claim 15 wherein the capillary grooves are interconnected.

17. The apparatus of claim 15 wherein the capillary grooves comprise an electroplated metal.

18. The apparatus of claim 15 wherein the container comprises a metal or a semiconductor.

19. The apparatus of claim 15 wherein the working fluid comprises water or methanol.

20. The apparatus of claim 15 further comprising a plurality of support posts located within the container between a pair of opposing major inner surfaces of the container, with each support post being located within one of the evaporator regions at a position above which a heat source is to be located.

21. The apparatus of claim 15 further comprising a sintered metal wick structure located within the container to provide a path for the working fluid as a liquid between the opposing major inner surfaces of the container.

22. A parallel-plate heat pipe apparatus for conducting heat from a heat source to a heat sink, comprising:
   (a) a pair of substantially parallel plates connected together to form a hollow sealed container;
   (b) an evaporator region located on a portion of a major inner surface of one of the pair of parallel plates proximate to where the heat source is to be attached;
   (c) a condenser region located within the container proximate to a side of the container where the heat sink is to be attached;
   (d) a working fluid disposed within the interior of the container, the working fluid in a vapor state transferring heat from the evaporator region to the condenser region; and
   (e) a plurality of curvilinear capillary grooves formed on the major inner surface on one or both of the parallel plates directly connecting the condenser region to the evaporator region to transfer by capillary action the working fluid in a liquid state from the condenser region to the evaporator region, with the plurality of curvilinear capillary grooves being arranged along paths defined by a calculated flow of the working fluid in the liquid state.

23. The apparatus of claim 22 wherein the capillary grooves comprise an electroplated metal.

24. The apparatus of claim 22 wherein the plates forming the container comprise a metal or a semiconductor.

25. The apparatus of claim 24 wherein the plates comprise copper or aluminum.

26. The apparatus of claim 25 wherein the plates are connected together by electron beam welding.

27. The apparatus of claim 22 wherein the working fluid comprises water or methanol.

28. The apparatus of claim 22 further comprising a support post located between the pair of plates and attached at each end to one of the pair of the plates within one of the evaporator regions at a position above which a heat source is to be located.

29. The apparatus of claim 28 wherein the support post is attached to the pair of the plates by resistance welding.

30. The apparatus of claim 28 further comprising a sintered metal wick structure located within the container to provide a flow path for transfer of the working fluid in the liquid state between the pair of plates.

31. The apparatus of claim 22 wherein the amount of the working fluid disposed within the container is determined by completely filling the container with the working fluid, and using a timed evacuation procedure to remove a portion of the working fluid from the container.

32. The apparatus of claim 15 further comprising a plurality of metal support posts located within the container between a pair of opposing major inner surfaces of the container.

33. The apparatus of claim 22 further comprising a metal support post located between the pair of plates and attached at each end to one of the pair of the plates.

* * * * *